United States Patent [19]
Kawamoto

[11] Patent Number: 5,381,093
[45] Date of Patent: Jan. 10, 1995

[54] MAGNETIC RESONANCE IMAGING APPARATUS

[75] Inventor: Hiromi Kawamoto, Yaita, Japan

[73] Assignee: Kabushiki Kaisha Toshiba, Kawasaki, Japan

[21] Appl. No.: 986,352

[22] Filed: Dec. 7, 1992

[30] Foreign Application Priority Data

Dec. 9, 1991 [JP] Japan .................................. 3-324780

[51] Int. Cl.⁶ .................................................. G01R 33/20
[52] U.S. Cl. .................................................. 324/318
[58] Field of Search ............... 324/300, 307, 309, 310, 324/311, 312, 313, 314, 318, 319, 320, 322; 128/653.5

[56] References Cited

U.S. PATENT DOCUMENTS

| | | | |
|---|---|---|---|
| 4,642,569 | 2/1987 | Hayes et al. | 324/318 |
| 4,879,515 | 11/1989 | Roemer et al. | 324/318 |
| 4,965,521 | 10/1990 | Egloff | 324/312 |

*Primary Examiner*—Michael J. Tokar
*Attorney, Agent, or Firm*—Limbach & Limbach

[57] ABSTRACT

The MR imaging apparatus comprises an RF shield for interposed between the set of gradient coil and the RF coil. The RF shield is a cylinder which longitudinal axis is substantially coincident to the z-axis in which a static magnetical field is applied. The RF shield comprises two conductive sheet-members which are half-cylinder respectively and integrated into one cylinder. The sheet members have a plurality of generally C-shaped conductive loop portions respectively which are defined by nonconductive lines parallel to RF current flow induced therein by the RF coil and a single radial cut line respectively. The RF shield comprises a connecting means for electrically connecting the C-shaped conductive loop portions so that the C-shaped conductive loop portion in one of the sheet members and corresponding C-shaped conductive loop portion in the other sheet member can be formed into one circuit respectively and a current can circulate in said circuit in the same direction around a y-axis orthogonal to the z-axis.

21 Claims, 9 Drawing Sheets

MAGNETIC RESONANCE IMAGING APPARATUS

BACKGROUND OF THE INVENTION

This invention relates to magnetic resonance(MR) imaging apparatus and, more particularly, to an MR imaging apparatus comprising an RF shield for placement between an RF coil and a set of gradient coils.

An MR imaging apparatus comprises a magnet means for applying a static magnetic field to a human body, a gradient coil means for providing a magnetic gradient which is superimposed on the static magnetic field and an RF coil means for transmitting an RF pulse(typically about 10 MHz) to the body and receiving an echo data from the body.

The gradient coil means typically utilizes a set of three gradient coils Gx, Gy and Gz to obtain spatially-selective information. Each of the, these gradient coils generally contains a multiplicity of turns of conductive wire.

RF fields lose a significant portion of their energy if these fields impinge upon the conductive wires of the gradient coils. Any RF power loss, in the gradient coils or otherwise, appears as a lowering of the quality factor Q of the RF coil and consequently appears as a lowering of the signal to noise ratio(SNR) attainable in the imaging device.

Accordingly, it is highly desirable to prevent penetration of the RF field into the gradient coils.

A shield is typically placed between the RF coil and the gradient coils.

The RF shield must, however, be substantially transparent to the gradient magnetic fields and therefore must prevent inducement of any significant shield currents at gradient frequencies (typically less than about 10 KHz) to prevent temporally-dependent and/or spatially dependent magnetic field inhomogeneities which causes an adverse affect on the resulting image.

U.S. Pat. No. 4,879,515, issued Nov. 7, 1989 to Roemer et al. discloses a radio-frequency(RF) shield, for use interposed between a set of gradient coils and an RF coil, for example, "birdcage" coil in an NMR imaging device, which is formed of a conductor-dielectric-conductor laminate.

Each conductive layer of the laminate has a plurality of conductive streamline loop portions which are each defined by nonconductive cut lines parallel to RF current flow induced therein and a radial cut line separating each loop portion into a generally "C"-shaped conductive loop portion.

According to Roemer's Patent, the high frequency RF current can flow along the C-shaped conductive loop portion through capacitors made along the radial cut line and the low frequency gradient current flow can be prevented because of the radial cut line.

However, first of all, an impedance of a circuit, along which the RF shield current flows, can not be reduced so much because of the location of the capacitor, thus the impinging of the RF field upon the gradient coils can not be prevented perfectly. Secondly, because of the laminate, a construction of the RF shield is complicated to increase a cost for making the RF shield. Thirdly, other type of an RF coil can not be used because the nonconductive cut line are defined for the predetermined RF coil, for example, "birdcage" type of RF coil.

SUMMARY OF THE INVENTION

An object of this invention is to provide an MR imaging apparatus comprising an RF shield for shielding a high frequency RF field induced by an RF coil and penetrating a low frequency gradient field applied by gradient coils.

Another object of this invention is to provide an RF shield for shielding a high frequency RF field and penetrating a low frequency field.

According to this invention, there is provided an MR imaging apparatus comprising:

a magnet means for applying a static magnetic field to a specimen along a first axis;

a gradient coil means for providing a magnetic gradient which is superimposed on the static magnetic field;

an RF coil means for transmitting an RF pulse to the specimen along a second axis orthogonal to the first axis and receiving an echo data from the specimen; and an RF shield interposed between said gradient coil means and said RF coil means, wherein said RF shield comprising a first sheet member and a second sheet member located in a position at which said first and second sheet member interpose the specimen, said first and second sheet members having a plurality of generally C-shaped conductive loop portions respectively which are defined by at least one nonconductive line parallel to RF current flow induced therein and a single radial cut line respectively and said C-shaped conductive loop portions being connected by means of a connecting means so that at least one of said C-shaped conductive loop portions in said first sheet member and corresponding one of C-shaped conductive loop portions in said second sheet member can be formed into one circuit respectively and a current can circulate in said circuit in a same direction around the second axis.

In one preferred embodiment, said connecting means comprises a plurality pairs of connecting members for connecting both ends of each of said C-shaped conductive loop portions in said first sheet member to both ends of corresponding one of said C-shaped conductive loop portions in said second sheet member.

In another preferred embodiment, at least two of said C-shaped conductive loop portions are connected by a capacitor means.

Therefore, various types of RF coil can be utilized because an RF current induced by an RF coil different from the RF coil for which the nonconductive lines are defined, can flow through the capacitor means.

According to this invention, there is further provided an MR imaging apparatus comprising:

a magnet means for applying a static magnetic field to a specimen along a first axis;

a gradient coil means for providing a magnetic gradient which is superimposed on the static magnetic field;

an RF coil means for transmitting an RF pulse to the specimen along a second axis orthogonal to the first axis and receiving an echo data from the specimen; and an RF shield interposed between said gradient coil means and said RF coil means, wherein said RF shield comprising a first sheet member and a second sheet member located in a position at which said first and second sheet member interpose the specimen, said first and second sheet members having a plurality of generally C-shaped conductive loop portions respectively which are defined by at least one nonconductive line parallel to RF current flow induced therein and a single radial cut line respectively and adjacent ends of at least one of said C-shaped conductive loop portions being connected by a capacitor means.

In one preferred embodiment, said capacitor means comprises a portion in which said adjacent ends are overlapped with an nonconductive member interposed.

An impedance of a circuit including the C-shaped conductive loop portion and the overlapped portion, does not become zero because the overlapped portion has a capacitance and high frequency RF wave can not be shielded perfectly. However, the high frequency RF wave can be shielded in a substantially identical extent of Roemer's RF shield and using more simple construction.

According to this invention, there is further provided an RF shield for shielding an RF wave transmitted to a specimen along a predetermined axis, comprising:
a first sheet member;
a second sheet member located in a position at which said first and second sheet member interpose the specimen, said first and second sheet members having a plurality of generally C-shaped conductive loop portions respectively which are defined by at least one nonconductive line parallel to RF current flow induced therein and a single radial cut line respectively; and
a connecting means for connecting said C-shaped conductive loop portions so that at least one of said C-shaped conductive loop portions in said first sheet member and corresponding one of said C-shaped conductive loop portions in said second sheet member can be formed into one circuit respectively and a current can circulate in said circuit in a same direction around the axis.

According to this invention, there is further provided an RF shield for shielding an RF wave transmitted to a specimen along a predetermined axis, comprising:
a first sheet member;
a second sheet member located in a position at which said first and second sheet member interpose the specimen, said first and second sheet members having a plurality of generally C-shaped conductive loop portions respectively which are defined by at least one nonconductive line parallel to RF current flow induced therein and a single radial cut line respectively; and
a capacitor means connected adjacent ends of at least one of said C-shaped conductive loop portions.

BRIEF DESCRIPTION OF THE DRAWINGS

For a more complete understanding of this invention, reference will be made to the following detailed explanations in conjunction with the accompanying drawing in which.

DESCRIPTION OF THE PREFERRED EMBODIMENTS

Figure 1:
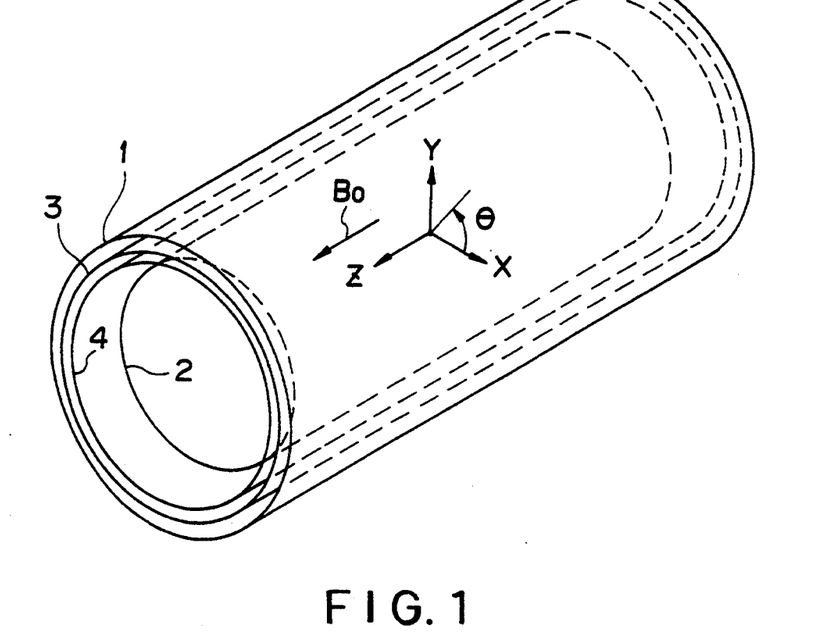
FIG. 1 is a perspective view showing an MR imaging apparatus embodying this invention.

Referring now to the accompanying drawing, the MR imaging apparatus, as shown in FIG. 1, comprises a magnet 1 for applying a static magnetic field $B_0$ to a specimen or a human body along a first axis, for example, a z-axis, a set of gradient coils 3 for providing a magnetic gradient which is superimposed on the static magnetic field $B_0$, an RF coil 2 for transmitting an RF pulse to the human body along a second axis orthogonal to the first axis, for example, a y-axis and receiving an echo data from the human body.

Figure 2:
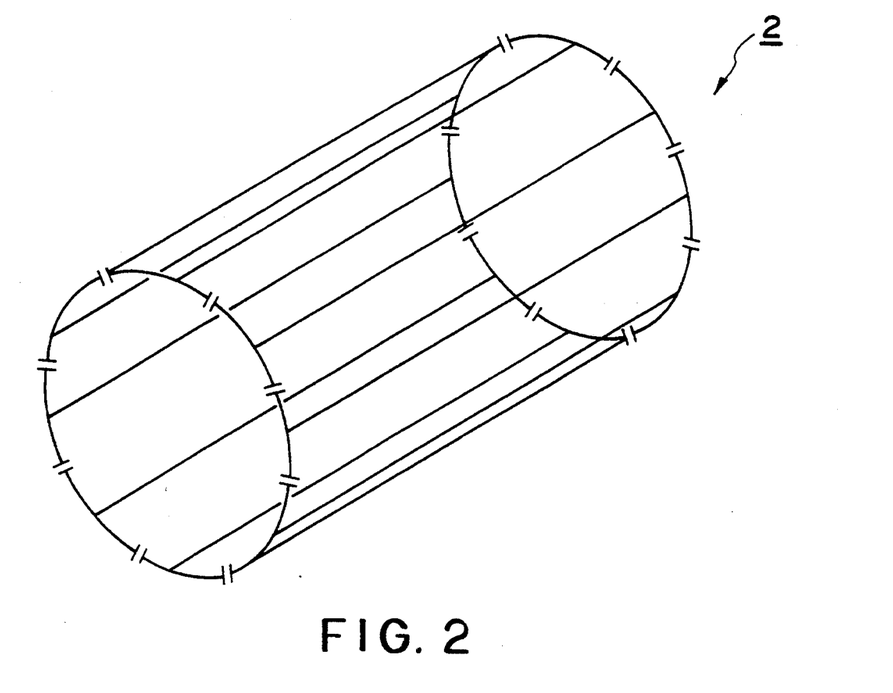
FIG. 2 is a perspective view showing an example of an RF coil.

FIG. 2 shows an example of the RF coil 2 as "bird cage" coil for whole body.

The MR imaging apparatus further comprises an RF shield 4 interposed between the set of gradient coil 3 and the RF coil 2. The RF shield 4 is a cylinder of which longitudinal axis is substantially coincident to the z-axis.

Figure 3:
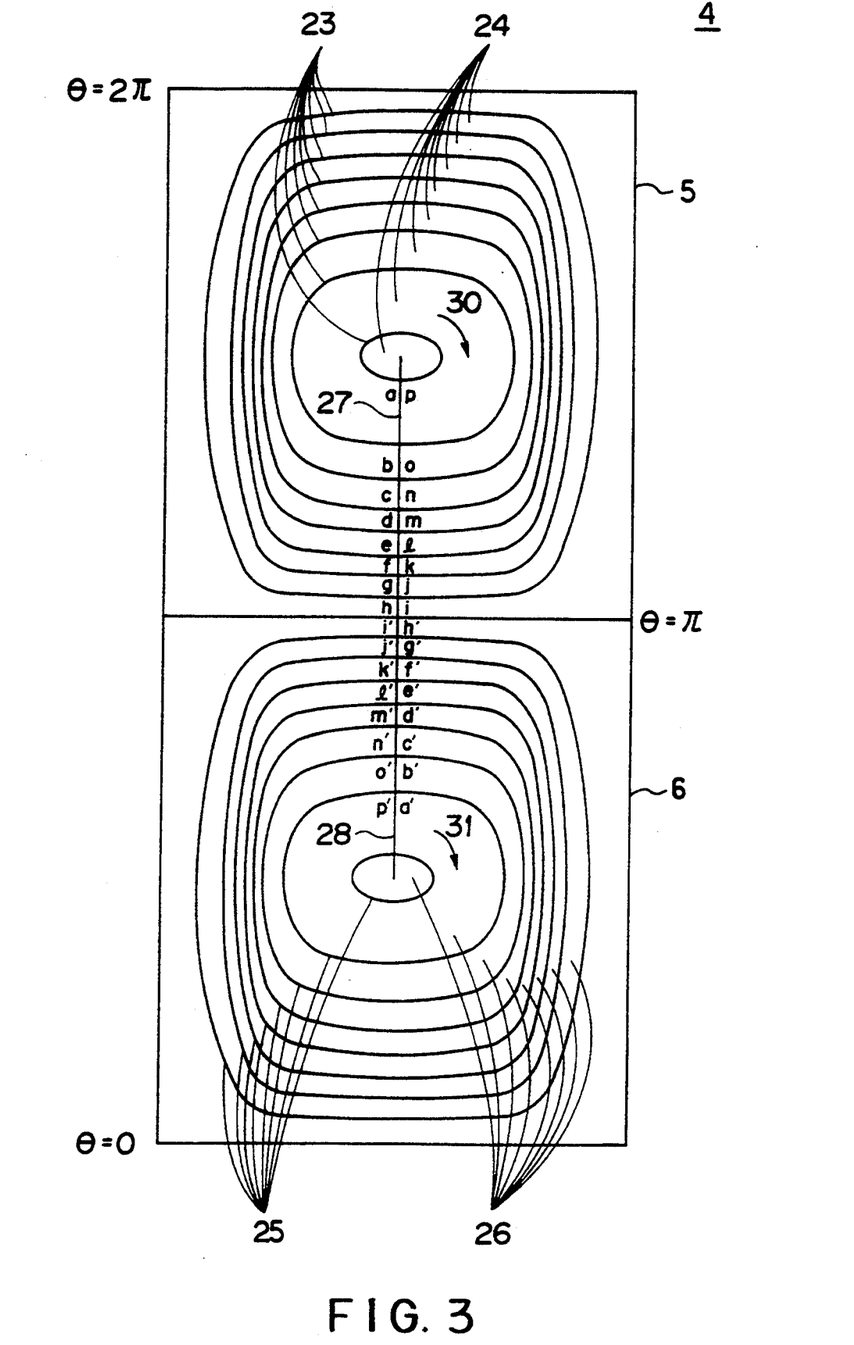
FIG. 3 is a developed view showing a preferred embodiment of an RF shield according to this invention.

FIG. 3 shows the RF shield 4 in a developed condition and $\theta$ values are angles from the x-axis in FIG. 1.

The RF shield 4 comprises a conductive sheet member 5 and a conductive sheet member 6 which are half-cylinder respectively and integrated into one cylinder.

The sheet members 5 and 6 have a plurality of generally C-shaped conductive loop portions 24 and 26 respectively which are defined by nonconductive lines 23 and 25 parallel to RF current flow induced therein by the RF coil 2 and a single radial cut line 27 and 28 respectively.

Figure 4:
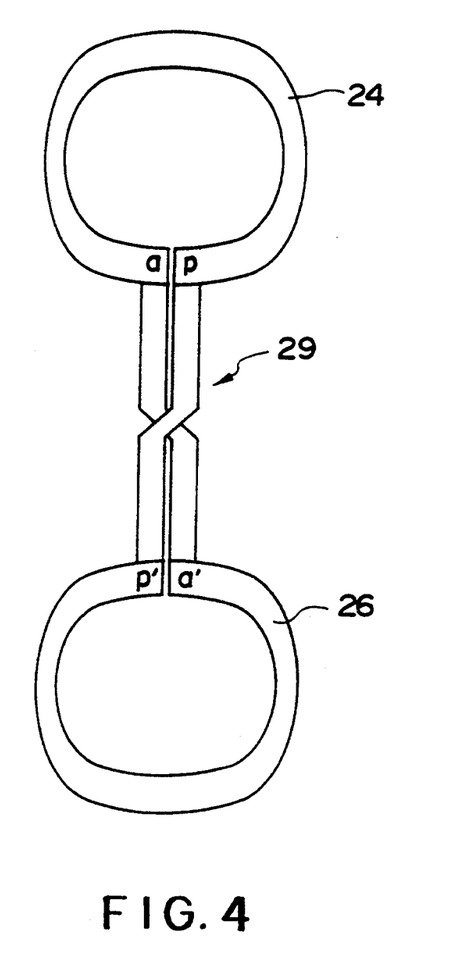
FIG. 4 is a developed view showing a part of the RF shield comprising a first C-shaped conductive loop portion, a second C-shaped conductive loop portion and a connecting means for connecting the first and second C-shaped conductive loop portion.

FIG. 4 is a developed view showing a part of the RF shield 4 comprising the C-shaped conductive loop portion 24, the C-shaped conductive loop portion 26 and a connecting means 29 for electrically connecting the C-shaped conductive loop portion 24 and 26, which are omitted for convenience in FIG. 1. The connecting means 29 comprises a pair of connecting members made by a conductive material, for example, copper tape but can be formed in a circuit board.

The connecting members 29 connect an end "a" of the loop portion 24 and an end "a'" of the loop portion 26 and connect an end "p" of the loop portion 24 and an end "p'" of the loop portion 26 so as to cross so that each of the loop portions 24 and a corresponding one of the loop portions 26, can be formed respectively into one circuit and a current can circulate in the circuit in the same directions around the y-axis (in FIG. 3 or FIG.

4, the current circulates, for example, clockwise in the loop portion 24 and counterclockwise in the loop portion 26). Crossed portions in the connecting members 29 are provided with a nonconductive layer, for example, polyethylene or Teflon(trade mark).

The other connecting members 29 which connect an end "b", "c", ... of the loop portion 24 and an end "b'", "c'", ... of the loop portion 26 and connect an end "o", "n", ... of the loop portion 24 and an end "o'", "n'", ... of the loop portion 26, are omitted in FIG. 3 and FIG. 4 but the RF shield 4 has eight (8) circuits and therefore the eight (8) pair of connecting members.

In operation, the RF coil 2 is operated to generate an RF field, the RF field impinge on the loop portion 24 and 26 of the RF shield 4 located outside the RF coil 2.

The circuits, above mentioned, are formed so that a current in the circuits can circulate in the same direction around the y-axis and the C-shaped looped portions are formed so that the nonconductive line 23 and 25 are parallel to RF current which may be induced by the RF coil 2.

Therefore, current caused by the RF field can flow in each circuits freely, the RF field can be shielded and thus impinging upon the gradient coil 3 by the RF field induced by the RF coil 2, can be prevented.

The Roemer's RF shield has a capacitor portion and an impedance for the RF field can not be reduced to zero. The circuits according to the embodiment do not include a capacitor and an impedance for high frequency wave can be reduced substantially to zero, and thus the shielding against the RF field can be performed efficiently.

A shielding current for shielding a gradient applied by the gradient coil Gz, flows along a line similar to the nonconductive line 23 and 25 but toward opposite directions around y-axis in the loop portion 24 and 26 (in FIG. 3, same directions 30 and 31).

However, because of the connecting members 29, an electromotive force generated in the loop portion 24 and an electromotive force generated in the loop portion 26 are cancelled and thus a shielding current for the gradient coil Gz do not flow. Thus, the gradient applied by the gradient coil Gz, can be transparent to the human body located inside the RF shield.

Therefore, the MR imaging apparatus embodying the invention can shield the RF field more efficiently and transparent the gradient field to the human body and thus the S/N ratio can be increased. The RF shield provided in the MR imaging apparatus is one-layer and the structure of the RF shield can be simplified.

Figure 5:
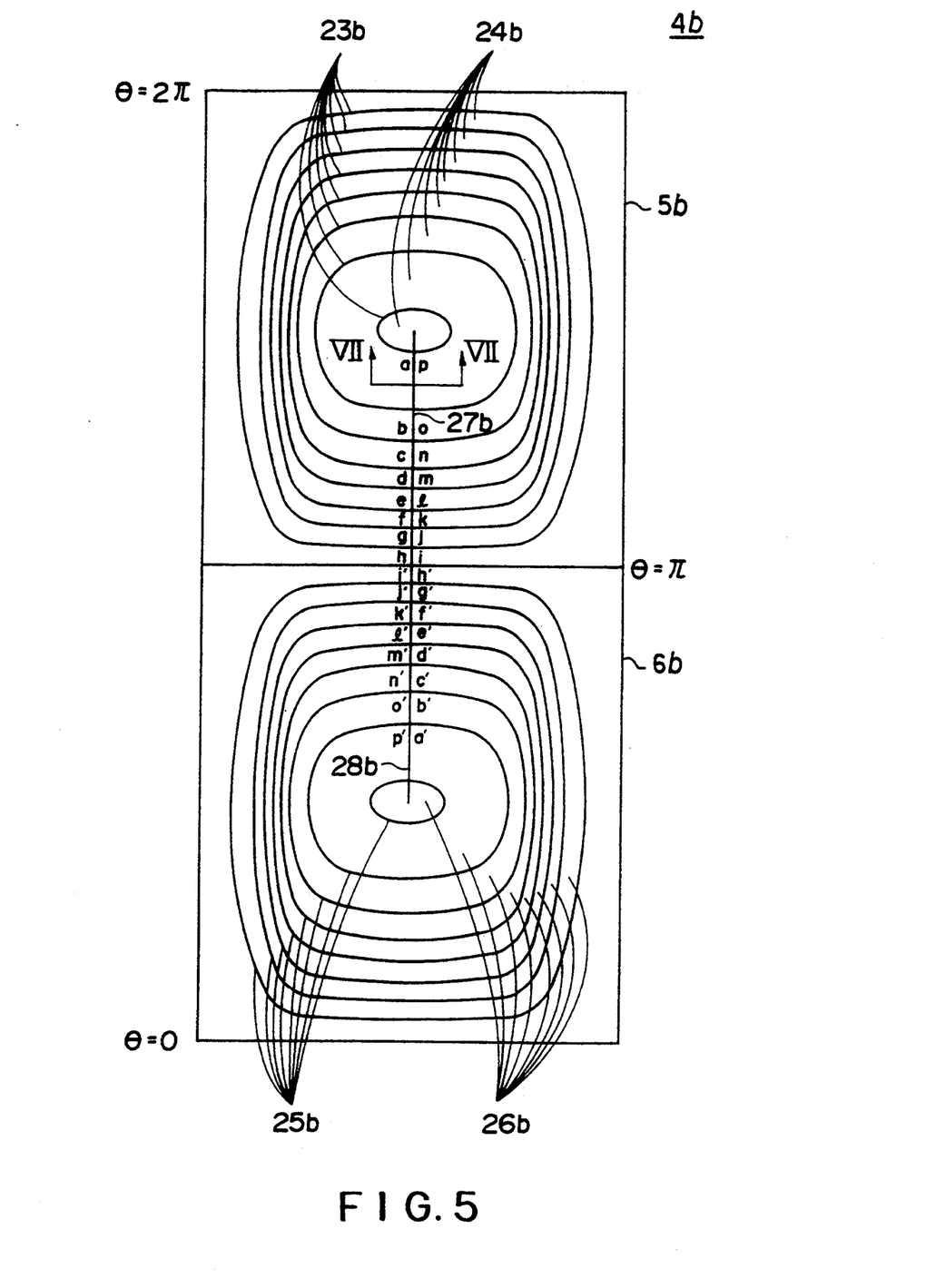
FIG. 5 is a developed view showing another preferred embodiment of an RF shield according to this invention.

FIG. 5 shows an RF shield according to another preferred embodiment of the invention which, similarly to the first embodiment, comprises a conductive sheet member 5b and a conductive sheet member 6b which are half-cylinder respectively and integrated into one cylinder. The sheet members 5b and 6b have a plurality of generally C-shaped conductive loop portions 24b and 26b respectively which are defined by nonconductive lines 23b and 25b parallel to RF current flow induced therein by the RF coil 2 and a single radial cut line 27b and 28b respectively but has two significant differences from the first embodiment previously described.

One diffence between both embodiments is that in the second embodiment there is not a connecting member. The other difference is that adjacent ends of the C-shaped conductive loop portions are connected by a capacitor means in the second embodiment, not shown in FIG. 5 because of convenience.

Figure 6:
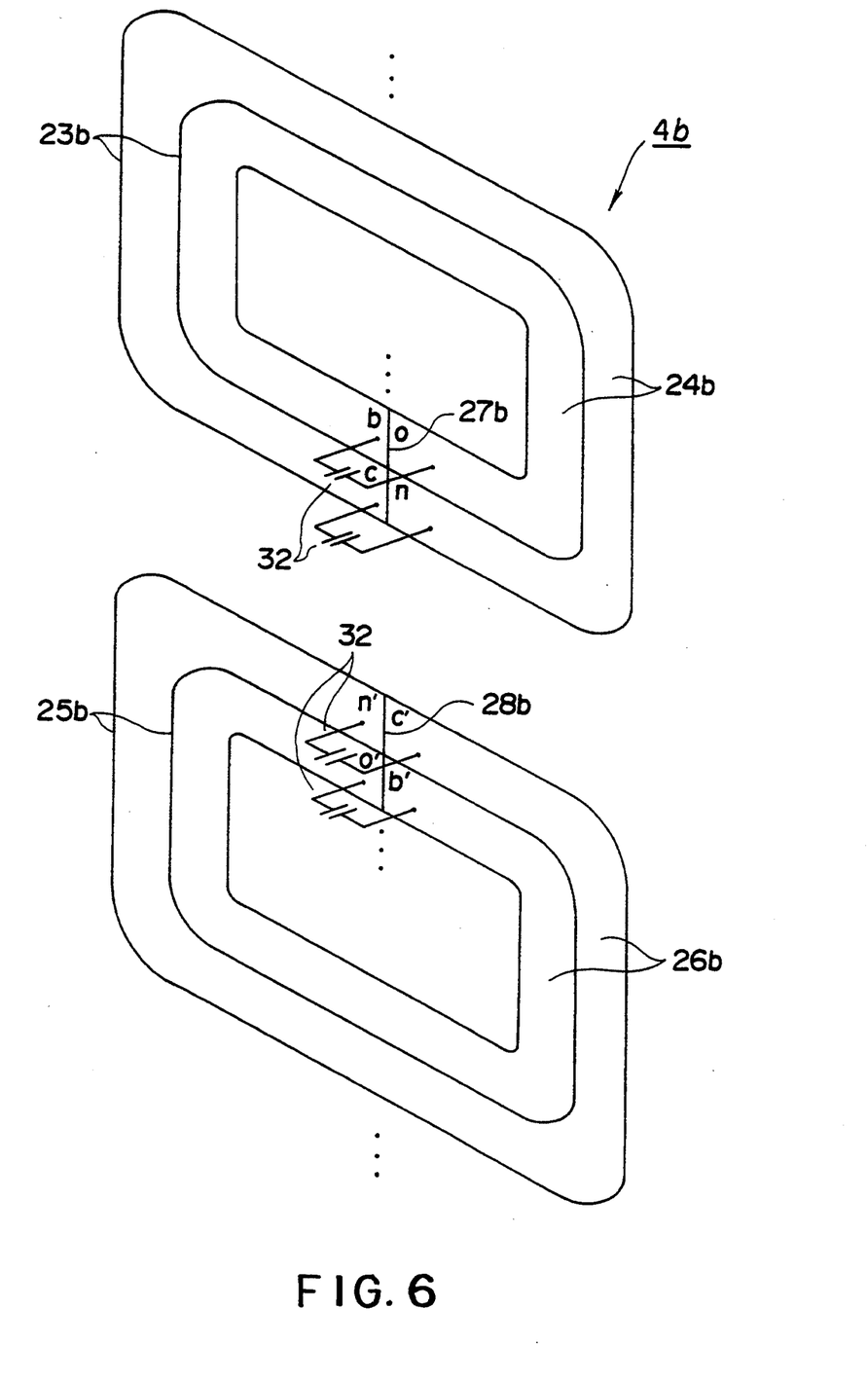
FIG. 6 is a perspective view showing a capacitive connection between both ends of the C-shaped conducitve loop portions.

FIG. 6 shows an RF shield according to the second embodiment which adjacent ends "c" and "n", "b" and "o", ... of the C-shaped conductive loop portions 24b are connected by a capacitor means 32 and similarly adjacent ends "c'" and "n'", "b'" and "o'", ... of the C-shaped conductive loop portions 26b are connected by a capacitor means 32.

Figure 7:
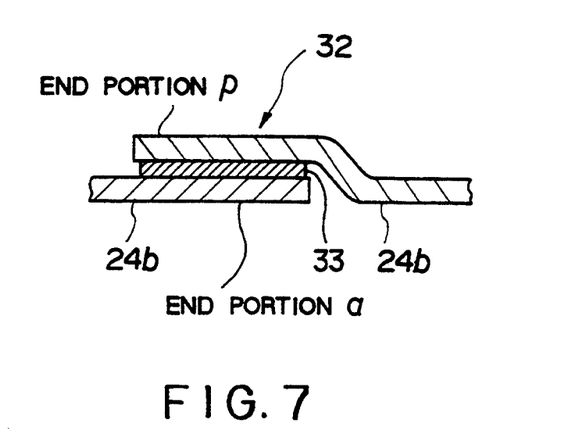
FIG. 7 is a sectional view showing the capacitive connection taken along the line VII-VII of FIG. 5.

FIG. 7 shows the capacitor means 32 in which said both ends are overlapped with an nonconductive member 33 interposed. Alternatively, the capacitor means 32 may comprise a capacitor. A capacitance value of the capacitor means 32 may be decided according to characteristics of the high frequency field caused by the RF coil 2 and the low frequency field caused by the gradient coil means 3. Therefore, all sets of ends of the C-shaped loop portion can be connected by the capacitor means or one set of ends of C-shaped loop portion can be connected.

According to the second embodiment, an impedance for a high frequency field, can not reduce to zero because there is a capacitance but the RF shield is one-layer structure and thus a structure of the RF shield can be more simplified than that of the Roemer's RF shield and a cost of the RF shield can be reduced.

A shielding current for a low frequency field induced by the gradient coil Gx and Gy, can be prevented to flow because a flow direction of the shielding current is not parallel to the nonconductive line 23b and 25b. A shielding current for a low frequency field induced by the gradient coil Gz, can be prevented to flow because there is a capacitor means 32.

Figure 8:
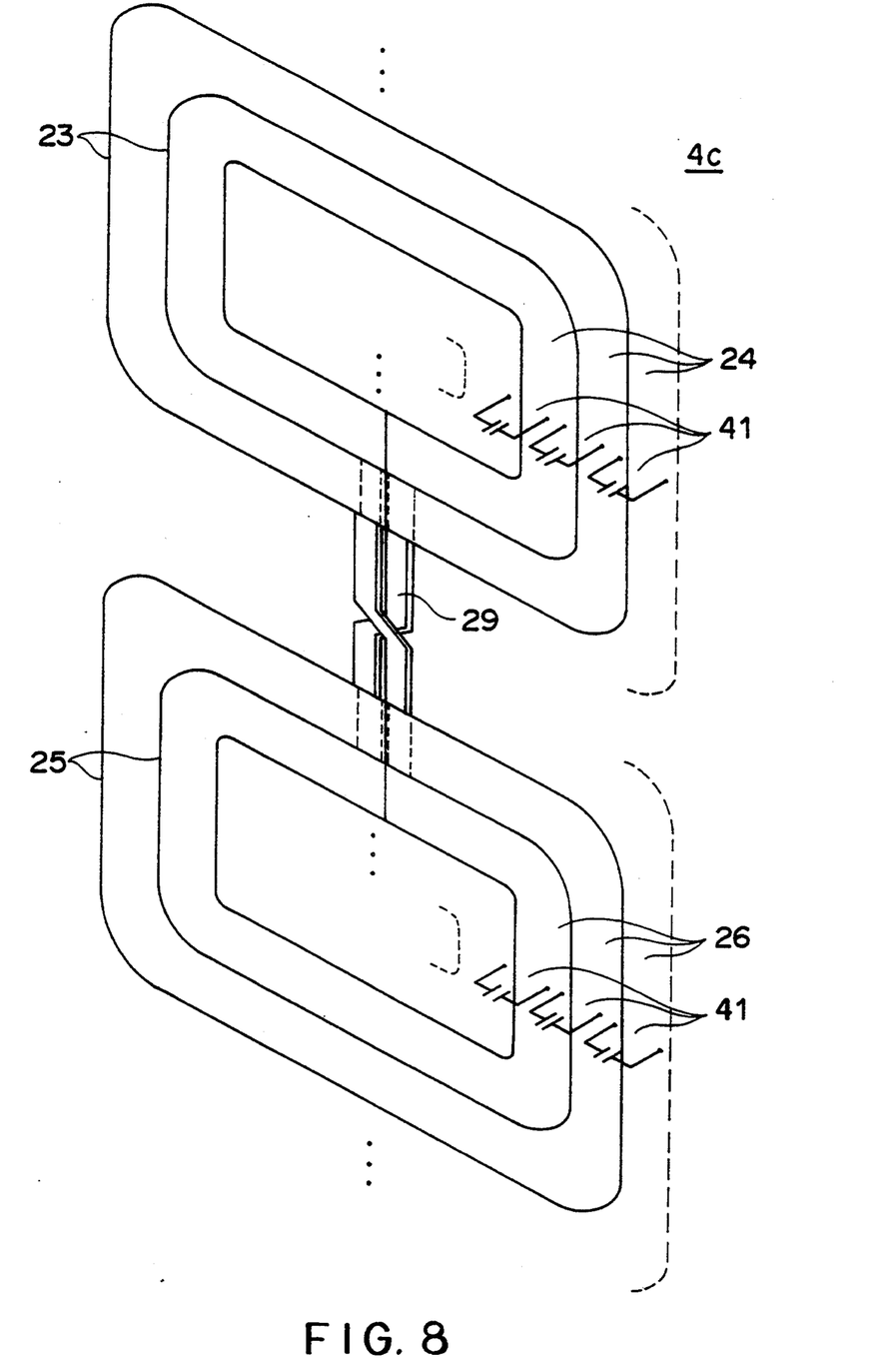
FIG. 8 is a perspective view showing a further preferred embodiment of an RF shield according to this invention.

FIG. 8 shows an RF shield according to further preferred embodiment of the invention which has a difference from the first embodiment previously described. The difference between the both embodiments is that different C-shaped conductive loop portions are connected by a capacitor means 41 in the third embodiment.

The capacitor means 41 may be an overlapped portion with a nonconductive material interposed or a capacitor, previously described in the second embodiment.

According to the third embodiment, a shielding current for an RF field induced by a predetermined RF coil 2, for example, a bird cage coil, can flow similarly to the first embodiment because curves of the nonconductive line 23 and 25 are defined by means of calculation etc. so that an RF current by an RF field induced by the RF coil 2 can flow in the conductive loop portion 24 and 26. Furthermore, a shielding current for another RF field induced by another RF coil, for example, surface coil, can flow because there is a capacitor means 41.

Therefore, in the RF shield according to the third embodiment of the invention, a shielding current for various type of RF coils including a whole body coil, a surface coil, QD coil etc., can flow simultaneouly.

A shielding current for a low frequency field induced by the gradient coil Gx and Gy, can be prevented to flow because a flow direction of the shielding current is not parallel to the nonconductive line 23 and 25 and difficult to flow through the capacitor means 41. A shielding current for a low frequency field induced by the gradient coil Gz, can be prevented by the connecting members 29, previously described in the first embodiment.

Figure 9:
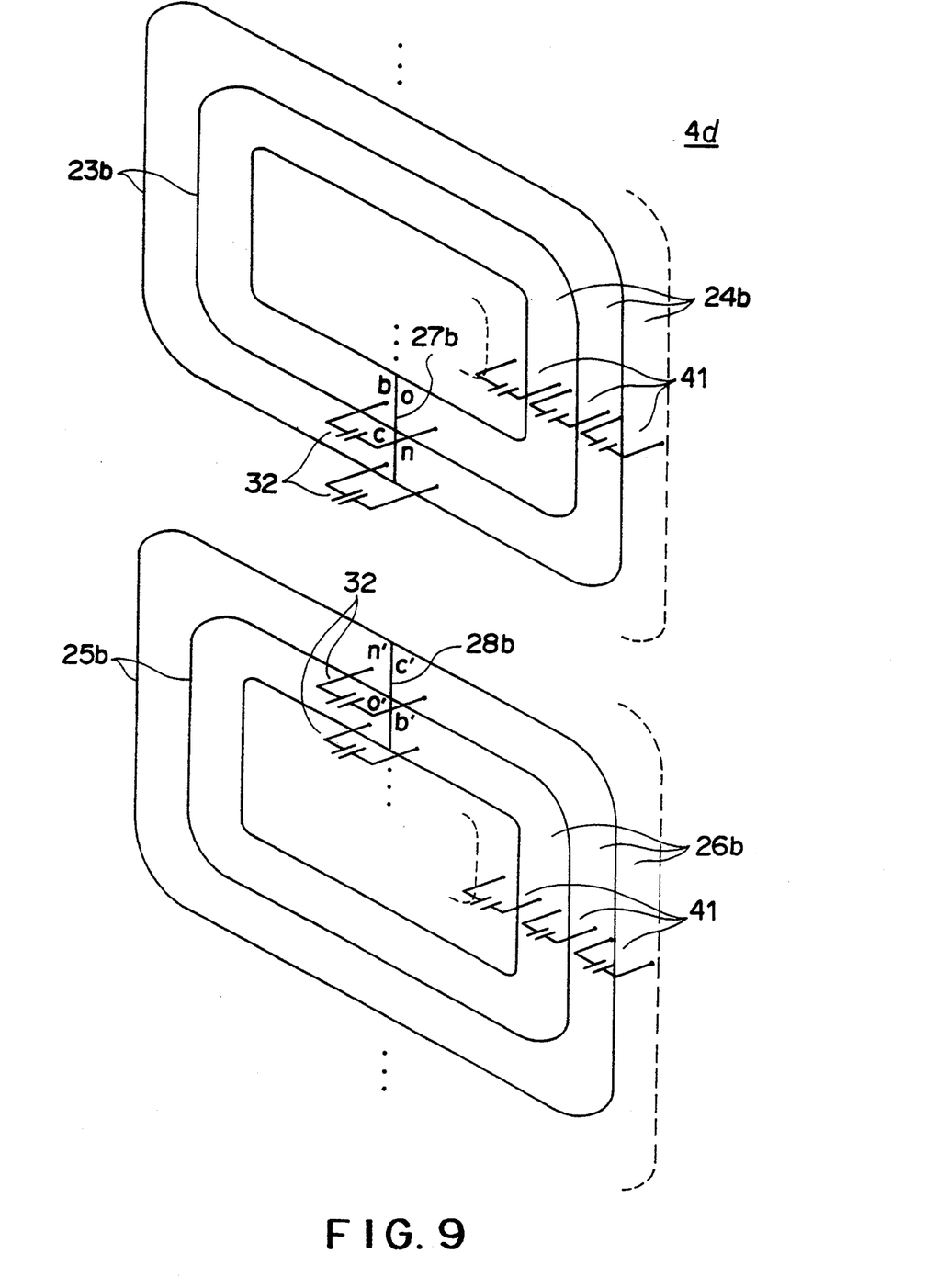
FIG. 9 is a perspective view showing a still further preferred embodiment of an RF shield according to this invention.

FIG. 9 shows an RF shield according to still a further preferred embodiment of the invention which has a difference from the second embodiment previously described. The difference between both the embodiments is that different C-shaped conductive loop portions are connected by a capacitor means 41 in the fourth embodiment similarly to the third embodiment.

A detailed description for the fourth embodiment is omitted because it has been previously described in the third embodiment.

In the RF shield according to the fourth embodiment of the invention, a shielding current for various type of RF coils, can flow and thus a plurality of RF coils including a whole body coil, a surface coil, a QD coil etc., can be utilized simultaneouly.

Figure 10:
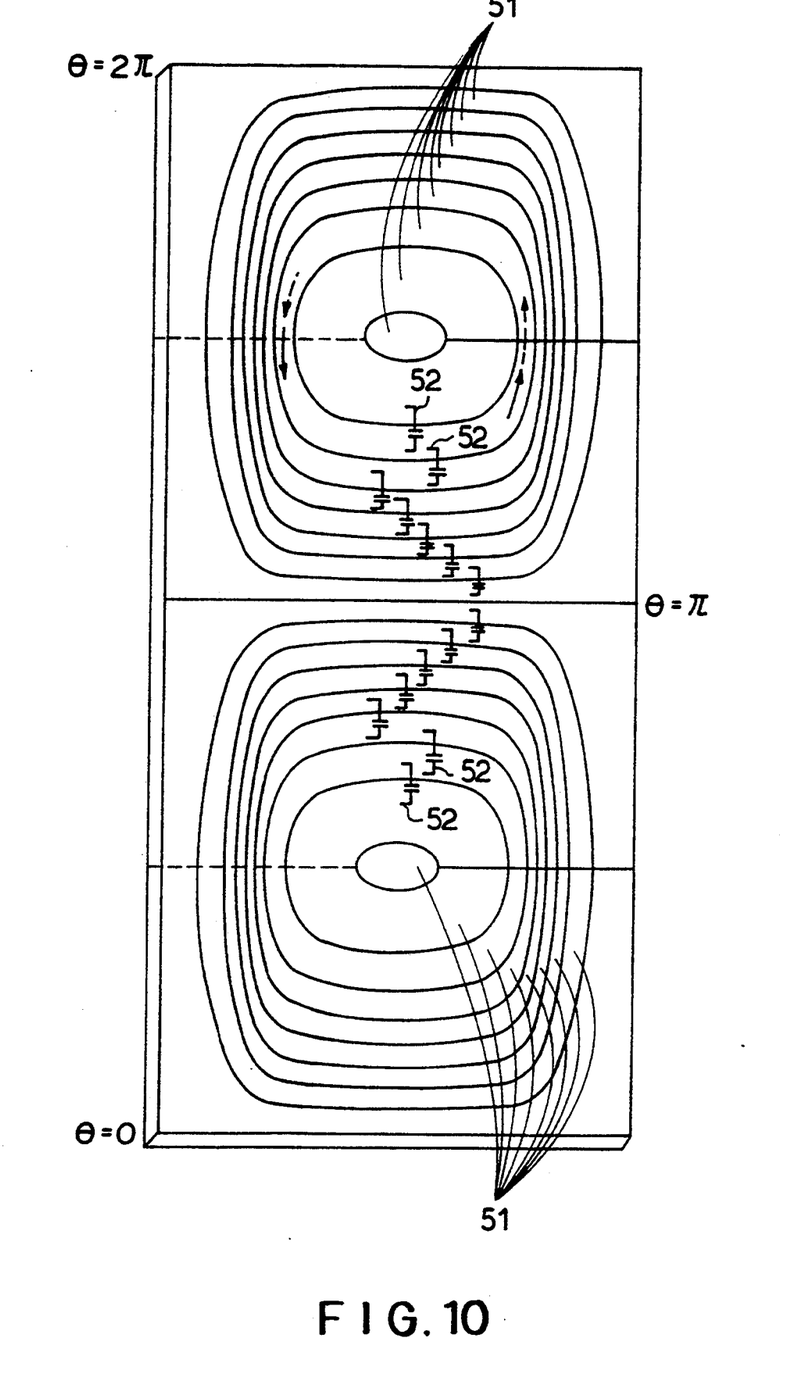
FIG. 10 is a developed view showing a still further preferred embodiment of an RF shield according to this invention.

FIG. 10 shows an RF shield according to still a further preferred embodiment of the invention which has a difference from the Roemer's RF shield. The difference between the fifth embodiment and the Roemer's RF shield is that different C-shaped conductive loop portions 51 are connected by a capacitor means 52 in the fifth embodiment. The capacitor means 52 may be provided in C-shaped conductive loop portions in a back side, not shown in FIG. 10.

In the RF shield according to the fifth embodiment of the invention, a shielding current for various type of RF coils, can flow and thus a plurality of RF coils including a whole body coil, a surface coil, a QD coil etc., can be utilized simultaneouly.

The RF shields according to the above described embodiments are utilized in the MR imaging apparatus but the RF shield of the invention can be utilized in various apparatus in which an RF wave must be shielded, for example, a hyperthermia.

In the above embodiments, one set of the RF shield is provided in the MR imaging apparatus but a plurality of the RF shields can be provided in the MR imaging apparatus. For example, RF current characteristics which correspond to a plurality of RF coils including a whole body coil, QD coil, surface coil etc. respectively, are estimated by, for example, calculating and then flow directions of the RF currents are defined and then, according to the flow directions RF shields, are prepared as RF shield elements and then these RF shield elements are laminated into one sheet as an integrated RF shield.

The RF shield elements comprise C-looped conductive loop portions corresponding to each type of the RF coils respectively so that RF currents can flow the corresponding RF shield elements freely and thus a plurality of RF coils including a whole body coil, a surface coil, a QD coil etc., can be utilized simultaneouly.

What is claimed is:

1. An MR imaging apparatus comprising:
   a magnet means for applying a static magnetic field to a specimens, the static magnetic field being oriented along a first axis direction of a three-axis coordinate system for the specimen;
   a gradient coil means for providing a magnetic gradient superimposed on the static magnetic field;
   an RF coil means, positioned between the gradient coil means and the specimen, for transmitting an RF pulse to the specimen in a second axis direction orthogonal to the first axis direction and receiving an echo data from the specimen; and
   an RF shield interposed between said gradient coil means and said RF coil means,
   wherein said RF shield comprises a first electrically-conductive sheet member and a second electrically-conductive sheet member coupled to each other, each of said first and second electrically-conductive sheet members having a plurality of generally C-shaped electrically-conductive loop portions defined by at least one electrically-nonconductive line formed therethrough and parallel to eddy RF current flows induced therein in response to excitation of the RF coil means and a single radial cut line across the electrically-nonconductive line so as to form the generally C-shaped electrically-conductive loop portions and at least one of said C-shaped electrically-conductive loop portions in said first electrically-conductive sheet member and a corresponding one of said C-shaped electrically-conductive loop portions in said second electrically-conductive sheet member, symmetrically positioned with respect to said C-shaped loop portion in said first sheet member and electrically connected to each other by a connecting means to form an electrical loop through which the eddy currents flow in a same direction around the second axis direction.

2. An MR imaging apparatus according to claim 1, wherein said connecting means comprises a pair of connecting members, made of an electrically-conductive material, for connecting both ends of said C-shaped electrically-conductive loop portion in said first electrically-conductive sheet member to both ends of said C-shaped electrically-conductive loop portion in said second electrically-conductive sheet member.

3. An MR imaging apparatus according to claim 1, wherein at least two of said C-shaped electrically-conductive loop portions are connected to each other through a capacitor means.

4. An MR imaging apparatus comprising:
   a magnet means for applying a static magnetic field to a specimen, the static magnetic field being oriented along a first axis direction of a three-axis coordinate system for the specimen;
   a gradient coil means for providing a magnetic gradient superimposed on the static magnetic field;
   an RF coil means, arranged inside the gradient coil means and surrounding the specimen, for transmitting an RF pulse to the specimen in a second axis direction orthogonal to the first axis direction and receiving an echo data from the specimen; and
   an RF shield interposed between said gradient coil means and said RF coil means,
   wherein said RF shield comprises a first electrically-conductive sheet member and a second electrically-conductive sheet member coupled to each other, each of said first and second electrically-conductive sheet members having a plurality of generally C-shaped electrically-conductive loop portions defined by at least one electrically-nonconductive line formed therethrough parallel to eddy RF current flows induced therein in response to excitation of the RF coil means and a single radial cut line across the electrically-nonconductive line forming the generally C-shaped electrically-conductive and adjacent ends of at least one of said C-shaped electrically-conductive loop portions being connected to each other through a capacitor means.

5. An MR imaging apparatus according to claim 4, wherein said capacitor means comprises adjacent ends of said C-shaped loop portions overlapping one another with an electrically-nonconductive member interposed therebetween.

6. An MR imaging apparatus according to claim 4, wherein at least two of said C-shaped electrically-conductive loop portions are connected to each other through a capacitor means.

7. An RF shield for shielding an RF wave, wherein the RF wave is transmitted from a predetermined axis direction of a three-axis coordinate system for the RF shield, the RF shield comprising:
a first and a second electrically-conductive sheet members coupled to each other, each of said first and second electrically-conductive sheet members having a plurality of generally C-shaped electrically-conductive loop portions defined by at least one electrically-nonconductive line formed therethrough and parallel to eddy RF current flows induced therein in response to the transmitted RF wave and a single radial cut line across the electrically-nonconductive line forming the generally C-shaped electrically-conductive loop portions; and
a connecting means for electrically connecting at least one of said C-shaped electrically-conductive loop portions in said first electrically-conductive sheet member to a corresponding one of said C-shaped electrically-conductive loop portions in said second electrically-conductive sheet member symmetrically positioned thereto, to form an electrical loop through which the eddy currents flow in a same loop-like direction around the predetermined axis direction.

8. An RF shield for shielding an RF wave, wherein the RF wave is transmitted from a predetermined axis direction of a three-axis coordinate system for the RF shield, the RF shield comprising:
a first and second electrically-conductive sheet members coupled to each other, each of said first and second electrically-conductive sheet members having a plurality of generally C-shaped electrically-conductive loop portions defined by at least one electrically-nonconductive line formed therethrough and parallel to eddy RF current flows induced therein in response to the transmitted RF wave and a single radial cut line across the electrically-nonconductive line forming the generally C-shaped electrically-conductive loop portions; and
a capacitor means connecting adjacent ends of at least one of said C-shaped electrically-conductive loop portions.

9. An MR imaging apparatus according to claim 2, wherein said connecting members are arranged to spatially cross each other.

10. An MR imaging apparatus according to claim 9, wherein said electrically-conductive material is copper tape.

11. An MR imaging apparatus according to claim 3, wherein said at least two of the C-shaped electrically-conductive loop portions are adjacent to each other.

12. An MR imaging apparatus according to claim 6, wherein said at least two of the C-shaped electrically-conductive loop portions are adjacent to each other.

13. An MR imaging apparatus according to claim 7, wherein said connecting means comprises a pair of connecting members, made of an electrically-conductive material, for connecting both ends of said C-shaped electrically-conductive loop portion in said first electrically-conductive sheet member to both ends of said C-shaped electrically-conductive loop portion in said second electrically-conductive sheet member.

14. An MR imaging apparatus according to claim 13, wherein said connecting members are arranged to spatially cross each other.

15. An MR imaging apparatus according to claim 7, wherein at least two of said C-shaped electrically-conductive loop portions are connected to each other through a capacitor means.

16. An MR imaging apparatus according to claim 15, wherein said at least two of the C-shaped electrically-conductive loop portions are adjacent to each other.

17. An MR imaging apparatus according to claim 8, wherein said capacitor means comprises adjacent ends of said loop portions overlapping one another with an electrically-nonconductive member interposed therebetween.

18. An MR imaging apparatus according to claim 8, wherein at least two of said C-shaped electrically-conductive loop portions are connected to each other through a capacitor means.

19. An MR imaging apparatus according to claim 18, wherein said at least two of the C-shaped electrically-conductive loop portions are adjacent to each other.

20. An RF shield for shielding an RF wave transmitted from a predetermined axis direction, the RF shield comprising:
a first and second electrically-conductive sheet members coupled to each other, each of said first and second electrically-conductive sheet members having a plurality of generally C-shaped electrically-conductive patterns, insulated from one another, and having a portion parallel to eddy RF current flows induced therein in response to the transmitted RF wave; and
a connecting means for electrically connecting at least one of said C-shaped electrically-conductive loop portions in said first electrically-conductive sheet member to a corresponding one of said C-shaped electrically-conductive loop portions in said second electrically-conductive sheet member, symmetrically positioned thereto, to form an electrical loop through which the eddy currents flow in a same loop-like direction around the predetermined axis direction.

21. An MR imaging apparatus comprising:
a magnet means for applying a static magnetic field to a specimen, the static magnetic field being oriented along a first axis direction of a three-axis coordinate system for the specimen;
a gradient coil means for providing a magnetic gradient superimposed on the static magnetic field;
an RF coil means, positioned between the gradient coil means and the specimen, for transmitting an RF pulse to the specimen in a second axis direction orthogonal to the first axis direction and receiving an echo data from the specimen; and
an RF shield interposed between said gradient coil means and said RF coil means,
wherein said RF shield comprises a first electrically-conductive sheet member and a second electrically-conductive sheet member coupled to each other, each of said first and second electrically-conductive sheet members having a plurality of generally C-shaped electrically-conductive paths, insulated from one another and having a portion parallel to eddy RF current flows induced therein in response to excitation of the RF coil means and at least one of said C-shaped electrically-conductive paths in said first electrically-conductive sheet member and a corresponding one of said C-shaped electrically-conductive path in said second electrically-conductive sheet member, symmetrically positioned with respect to each other and electrically connected thereto by a connecting means to form an electrical loop through which the eddy currents flow in a same direction around the second axis direction.

* * * * *